(12) United States Patent
Zhu et al.

(10) Patent No.: US 11,262,408 B2
(45) Date of Patent: Mar. 1, 2022

(54) VEHICLE TRACTION BATTERY OVER-DISCHARGE DIAGNOSING METHOD AND ASSEMBLY

(71) Applicant: Ford Global Technologies, LLC, Dearborn, MI (US)

(72) Inventors: Di Zhu, Canton, MI (US); Mehdi Hosseinifar, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 67 days.

(21) Appl. No.: 16/799,120

(22) Filed: Feb. 24, 2020

(65) Prior Publication Data

US 2021/0263104 A1    Aug. 26, 2021

(51) Int. Cl.
  *G01R 31/382* (2019.01)
  *B60L 58/13* (2019.01)
  *B60L 58/14* (2019.01)
  *B60L 3/00* (2019.01)
  *H01M 10/44* (2006.01)
  *H01M 10/48* (2006.01)
  *H02J 7/00* (2006.01)
  *H01M 50/572* (2021.01)

(52) U.S. Cl.
  CPC .......... *G01R 31/382* (2019.01); *B60L 3/0084* (2013.01); *B60L 58/13* (2019.02); *B60L 58/14* (2019.02); *H01M 10/443* (2013.01); *H01M 10/486* (2013.01); *H01M 50/572* (2021.01); *H02J 7/00306* (2020.01); *H01M 2220/20* (2013.01)

(58) Field of Classification Search
  CPC .......................... G01R 31/382; H01M 50/572;
       H01M 10/443; H01M 10/486; H01M
       2220/20; B60L 58/13; B60L 3/0084;
       B60L 58/14; H02J 7/00306
  USPC ......................................................... 320/132
  See application file for complete search history.

(56) References Cited

U.S. PATENT DOCUMENTS 6,133,707 A * 10/2000 Kikuchi ................. B60L 58/10
                                                                  320/104
6,791,207 B2 * 9/2004 Yoshida .............. B60R 16/0315
                                                                  307/10.1

(Continued)

FOREIGN PATENT DOCUMENTS

CN        201985621 U  *  9/2011
CN        102520360 B  * 10/2014

(Continued)

OTHER PUBLICATIONS

Yang et al., (Yang)State of Charge Estimation for Lithium-Ion Battery with a Temperature-Compensated Model;Oct. 2017; www.mdpi.com/journal/energies; pp. 1-13 (Year: 2017).*

(Continued)

*Primary Examiner* — M Baye Diao
(74) *Attorney, Agent, or Firm* — David B. Kelley; Carlson, Gaskey & Olds, P.C.

(57) ABSTRACT

An over-discharge diagnosing method includes, among other things, evaluating concurrently, a voltage behavior of a battery pack, a current behavior of the battery pack, and a temperature behavior of the battery pack. The method further includes detecting an over-discharge based on the evaluating, and communicating an over-discharge notification in response to the detecting.

16 Claims, 5 Drawing Sheets

(56) References Cited

U.S. PATENT DOCUMENTS

| | | | |
|---|---|---|---|
| 6,885,168 B2 | 4/2005 | Okumura et al. | |
| 7,190,148 B2* | 3/2007 | Ooshita | H02J 7/0029 320/134 |
| 7,737,664 B2* | 6/2010 | Matsunaga | H03K 17/6874 320/134 |
| 7,834,792 B2* | 11/2010 | Sherry | H03M 1/0624 341/155 |
| 7,883,790 B2 | 2/2011 | Howard et al. | |
| 8,004,238 B2 | 8/2011 | Kim et al. | |
| 8,336,651 B2* | 12/2012 | Nishi | B60L 58/15 180/65.29 |
| 8,902,072 B2* | 12/2014 | Lee | G01R 31/28 340/636.1 |
| 9,358,899 B2* | 6/2016 | Decker | H01M 10/425 |
| 9,372,238 B2 | 6/2016 | Kim | |
| 9,395,327 B2 | 7/2016 | Baraszu et al. | |
| 9,431,837 B2 | 8/2016 | Brockman et al. | |
| 9,840,161 B2* | 12/2017 | Chikkannanavar | B60L 58/21 |
| 9,884,557 B2 | 2/2018 | Park | |
| 9,931,960 B2* | 4/2018 | Tabatowski-Bush | G01R 31/3835 |
| 10,011,266 B2 | 7/2018 | Lee et al. | |
| 10,705,152 B1* | 7/2020 | Weiss | G01R 31/3828 |
| 10,809,305 B2* | 10/2020 | Wang | G01R 31/3842 |
| 10,994,617 B2* | 5/2021 | Rahbari Asr | B60L 3/0046 |
| 2003/0011334 A1* | 1/2003 | Kifuku | B62D 5/0463 318/432 |
| 2006/0076930 A1* | 4/2006 | Ooshita | H02J 7/0029 320/134 |
| 2010/0000809 A1* | 1/2010 | Nishi | B60L 58/16 180/65.29 |
| 2012/0001595 A1* | 1/2012 | Maruyama | H02J 7/0016 320/118 |
| 2012/0005393 A1* | 1/2012 | Hu | G06F 13/385 710/313 |
| 2013/0179012 A1* | 7/2013 | Hermann | B60L 3/0046 701/22 |
| 2013/0187466 A1 | 7/2013 | Sakai et al. | |
| 2015/0177329 A1* | 6/2015 | Kiuchi | H01M 10/482 324/434 |
| 2017/0259687 A1* | 9/2017 | Chikkannanavar | H02J 7/0063 |
| 2018/0123357 A1* | 5/2018 | Beaston | H01M 10/425 |
| 2018/0131208 A1 | 5/2018 | Park | |
| 2019/0033393 A1* | 1/2019 | Karner | H01M 10/425 |
| 2019/0033397 A1* | 1/2019 | Karner | G01R 31/382 |
| 2019/0089019 A1* | 3/2019 | Lee | G01R 31/3842 |
| 2019/0265302 A1 | 8/2019 | Wang et al. | |
| 2020/0195040 A1* | 6/2020 | Patel | B66B 1/302 |
| 2020/0243819 A1* | 7/2020 | Leal Rodriguez | B60L 50/64 |

FOREIGN PATENT DOCUMENTS

| | | | | |
|---|---|---|---|---|
| CN | 104808151 | | 7/2015 | |
| CN | 104185779 B | * | 8/2016 | H01M 10/486 |
| CN | 110194079 A | * | 9/2019 | G01R 31/396 |
| JP | 3994570 B2 | * | 10/2007 | Y02E 60/10 |
| JP | 2014108028 A | * | 6/2014 | Y02T 90/16 |
| KR | 20080042236 A | * | 5/2008 | B60R 16/04 |
| WO | WO-2008135499 A1 | * | 11/2008 | G01R 19/2506 |
| WO | WO-2018190400 A1 | * | 10/2018 | B60W 20/50 |

OTHER PUBLICATIONS

Guo, R. et al. Mechanism of the entire overdischarge process and overdischarge-induced internal short circuit in lithium-ion batteries. Sci. Rep. 6, 30248; doi: 10.1038/srep30248 (2016).

Kasnatscheew, J. et al., Lithium ion battery cells under abusive discharge conditions: Electrode potential development and interactions between positive and negative electrode, Journal of Power Sources 362 (2017), p. 278-282.

Erol, S. et al., Influence of overcharge and over-discharge on the impedance response of LiCoO2|C batteries, Journal of Power Sources 270 (2014), p. 92-100.

He, H., et al., Failure Investigation of LiFePO4 Cells in Over-Discharge Conditions, Journal of the Electrochemical Society 160 (6), p. A793-A804, (2013).

Fear, C., et al., Elucidating Copper Dissolution Phenomenon in Li-Ion Cells under Overdischarge Extremes, Journal of the Electrochemical Society 165 (9), p. A1639-A1647, (2018).

Lai, X., et al., Electrical behavior of overdischarge-induced internal short circuit in lithium-ion cells, Electrochimica Acta 278 (2018), p. 245-254.

Zhang, L., et al., Capacity fading mechanism during long-term cycling of over-discharged LiCoO2/mesocarbon microbeads battery, Journal of Power Sources 293 (2015), p. 1006-1015.

* cited by examiner

VEHICLE TRACTION BATTERY OVER-DISCHARGE DIAGNOSING METHOD AND ASSEMBLY

TECHNICAL FIELD

This disclosure relates generally to detecting over-discharge of a traction battery.

BACKGROUND

Electrified vehicles differ from conventional motor vehicles because electrified vehicles are selectively driven using one or more electric machines powered by a traction battery. The electric machines can drive the electrified vehicles instead of, or in addition to, an internal combustion engine. An over-discharge of the traction battery as over-discharge can, in some situations, degrade performance.

SUMMARY

An over-discharge diagnosing method according to an exemplary aspect of the present disclosure includes, among other things, evaluating concurrently, a voltage behavior of a battery pack, a current behavior of the battery pack, and a temperature behavior of the battery pack. The method further includes detecting an over-discharge based on the evaluating, and communicating an over-discharge notification in response to the detecting.

Another example of the foregoing method includes detecting the over-discharge based on a change in a voltage change rate of the battery pack.

Another example of any of the foregoing methods includes detecting the over-discharge based on a current change rate being zero or negative, and the voltage change rate being zero or negative and less than a voltage threshold value.

In another example of any the foregoing methods, the detecting does not occur unless a current value of the battery pack is negative and a state of charge change rate of the battery pack is zero or negative.

Another example of any of the foregoing methods includes detecting the over-discharge based on a current change rate being both positive and greater than a threshold current change rate, and the voltage change rate being positive but less than a voltage threshold.

Another example of any of the foregoing methods includes detecting the over-discharge based on a state of charge of the battery pack being less than a state of charge threshold.

Another example of any of the foregoing methods includes detecting the over-discharge based on a temperature change rate of the battery pack being greater than or equal to a predefined threshold.

Another example of any of the foregoing methods includes reducing current in response to the over-discharge notification.

Another example of any of the foregoing methods includes opening contactors of the battery pack in response to the over-discharge notification.

Another example of any of the foregoing methods includes transmitting an alert to a user in response to the over-discharge notification.

In another example of any of the foregoing methods, the over-discharge detected during the detecting is an over-discharge of a battery cell within the battery pack.

In another example of any of the foregoing methods, the battery pack is a traction battery pack of an electrified vehicle.

An over-discharge diagnosing assembly according to another exemplary aspect of the present disclosure includes, among other things, a battery pack, a controller configured to detect an over-discharge by evaluating, concurrently, a voltage behavior, a current behavior, and a temperature behavior of the battery pack. The controller is further configured to communicate an over-discharge notification in response to the controller detecting the over-discharge.

In another example of the foregoing assembly, the battery pack is a traction battery pack of an electrified vehicle.

Another example of any of the foregoing assemblies includes contactors configured to open in response to the controller detecting the over-discharge.

In another example of any of the foregoing assemblies, the controller is a bussed electrical center.

In another example of any of the foregoing assemblies, the over-discharge is an over-discharge of at least one battery cell within the battery pack.

In another example of any of the foregoing assemblies, the controller is configured to detect the over-discharge based on a change in a voltage change rate of the battery pack.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates generally to detecting an over-discharge of a battery pack and, in particular, a traction battery of an electrified vehicle. The detecting can rely on voltage behaviors, current behaviors, and temperature behaviors of the battery pack. The behaviors are evaluated concurrently rather than, for example, sequentially. Although described with reference to a traction battery pack of an electrified vehicle, the over-discharge detecting techniques of this disclosure could be used in other types of applications, such as stationary energy storage.

Figure 1:
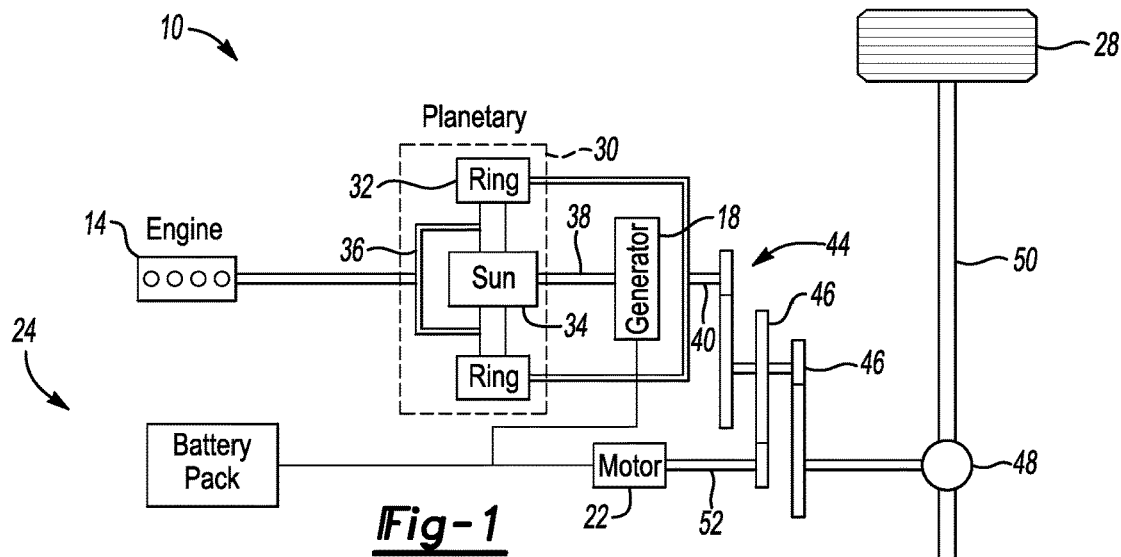
FIG. 1 schematically illustrates an exemplary powertrain of an electrified vehicle.

FIG. 1 schematically illustrates a powertrain 10 for an electrified vehicle. Although depicted as a hybrid electrified vehicle (HEV), it should be understood that the concepts described herein are not limited to HEVs and could extend to other electrified vehicles, including, but not limited to, plug-in hybrid electrified vehicles (PHEVs), fuel cell vehicles (FCVs), and battery electrified vehicles (BEVs).

In one embodiment, the powertrain 10 is a powersplit powertrain system that employs a first drive system and a second drive system. The first drive system includes a combination of an engine 14 and a generator 18 (i.e., a first electric machine). The second drive system includes at least a motor 22 (i.e., a second electric machine), the generator 18, and at least one battery pack 24. The first and second drive systems can each generate torque to drive one or more sets of vehicle drive wheels 28 of the electrified vehicle.

The engine 14, which is an internal combustion engine in this example, and the generator 18 may be connected through a power transfer unit 30. In one non-limiting embodiment, the power transfer unit 30 is a planetary gear set that includes a ring gear 32, a sun gear 34, and a carrier assembly 36. Of course, other types of power transfer units, including other gear sets and transmissions, may be used to connect the engine 14 to the generator 18.

The generator 18 can be driven by engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In this example, the second power transfer unit 44 is mechanically coupled to an axle 50 through the differential 48 to distribute torque to the vehicle drive wheels 28.

The motor 22 (i.e., the second electric machine) can also be employed to drive the vehicle drive wheels 28 by outputting torque to a shaft 52 that is also connected to the second power transfer unit 44. In one embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an example type of electrified vehicle battery assembly. The battery pack 24 may have the form of a high-voltage battery that is capable of outputting electrical power to operate the motor 22 and the generator 18. Other types of energy storage devices and/or output devices can also be used with the electrified vehicle having the powertrain 10. The battery pack 24 is a traction battery pack as the battery pack 24 can provides power to drive the vehicle drive wheels 28. The battery pack 24 can include a plurality of battery arrays each including a plurality of individual battery cells.

Figure 2:
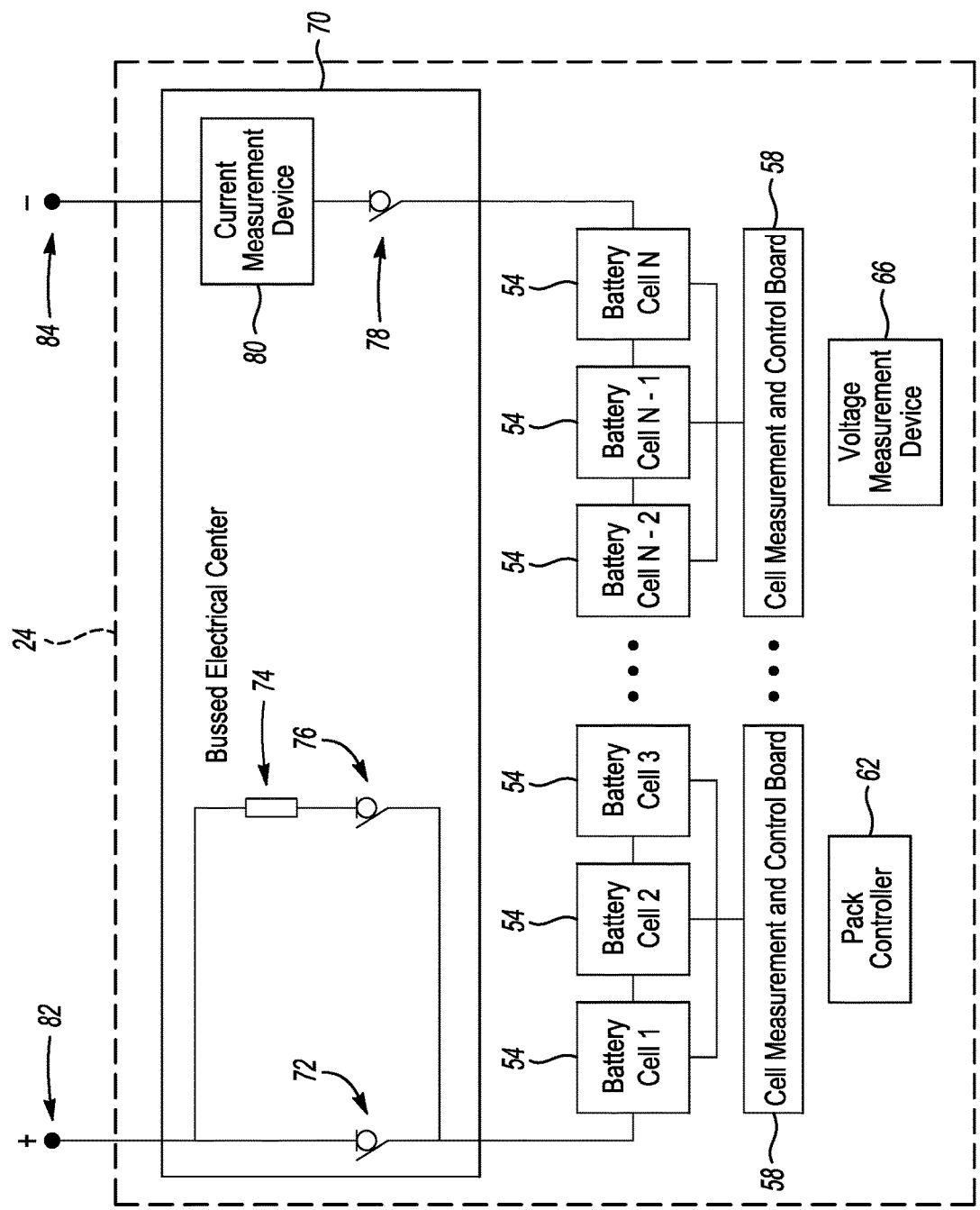
FIG. 2 schematically illustrates a battery pack from the powertrain of FIG. 1.

FIG. 2 illustrates a highly schematic view of the battery pack 24 of FIG. 1. The battery pack 24 includes a plurality of battery cells 54, cell measurement and controls (CMC) boards 58, a pack controller 62, a voltage measurement device 66, and a bussed electrical center (BEC) 70.

The BEC 70 includes a main positive contactor 72, a precharge resistor 74, a precharge contactor 76, a main negative contactor 78, and a current measurement device 80. The battery pack 24 is electrically and mechanically connected to powertrain 10 through both a positive terminal 82 and a negative terminal 84 when both the main contactors 72, 78 are closed.

In the exemplary embodiment, the CMC boards 58 are configured to measure cell voltage, cell current, and cell temperature. The CMC boards 58 are further configured to performing cell balancing. The CMC boards 58 can act as lower-level controllers to meet the demands from the pack controller 62. For drawing clarity, the operative connections between the CMC boards 58, the pack controller 62, and the contactors 72, 76, 78 are not illustrated in FIG. 2. The operative connections between the pack controller 62, the current measurement device 80, and the voltage measurement device 66 are also not shown for drawing clarity.

The BEC 70, pack controller 62, and CMC boards 58 can be part of a battery electric control module within an electrified vehicle having the powertrain 10 of FIG. 1. The BEC 70, pack controller 62, and CMC boards 58 can each includes processors operatively linked to a respective memory portion. The processors can be programmed to execute a program stored in the memory portion. The program may be stored in the memory portion as software code. The program stored in the memory portion may include one or more additional or separate programs, each of which includes an ordered list of executable instructions for implementing logical functions.

The processors can be a custom made or commercially available processor, a central processing unit (CPU), an auxiliary processor among several processors associate with the BEC, a semiconductor based microprocessor (in the form of a microchip or chip set) or generally any device for executing software instructions.

The memory portions can include any one or combination of volatile memory elements and/or nonvolatile memory elements. The memory portions can also have a distributed architecture, where various components are situated remotely from one another, but can be accessed by the respective processors.

Generally, voltage, current, and temperature of the battery pack 24 are interrelated. For example, when temperature changes during operation of the battery pack 24, the current and voltage will have some correlated behaviors. Similarly, as current changes, the temperature and voltage will have some correlated behaviors. The elements of the battery pack 24 can rely on the current behaviors, temperature behaviors, and voltage behaviors of the battery pack 24 to detect over-discharge of battery cells 54 of the battery pack 24. In an example, the pack controller 62 continually executes an over-discharge diagnosing method to detect an over-discharge.

Figure 3:
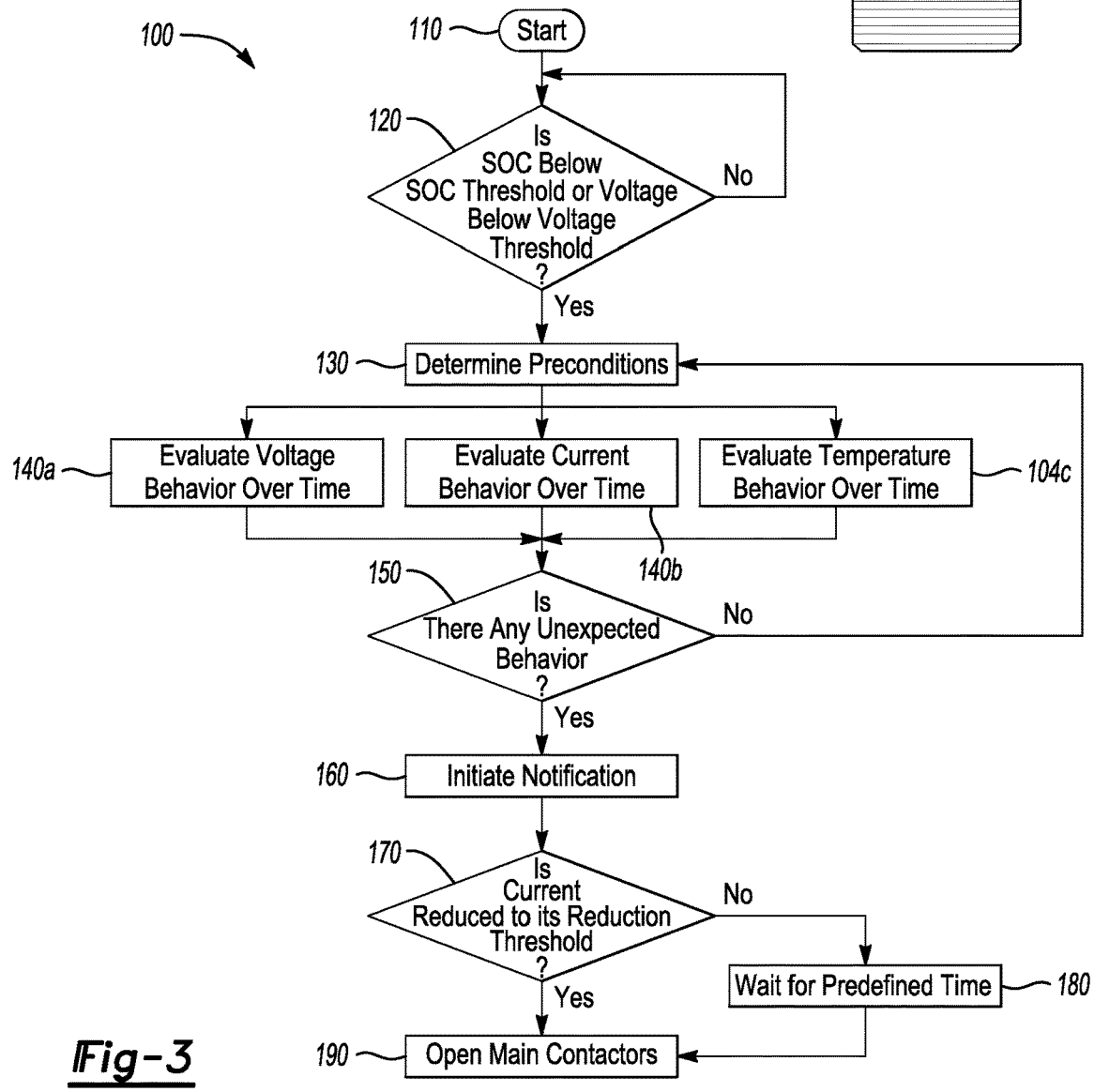
FIG. 3 illustrates a flow of an over-discharge diagnosing method used in connection with the battery pack of FIG. 2 according to an exemplary embodiment of the present disclosure.

The flow of an exemplary over-discharge diagnosing method 100 is shown in FIG. 3. Generally, the disclosed method 100 concurrently evaluates current behaviors, temperature behaviors, and voltage behaviors of the battery pack 24. The method 100 detects an over-discharge condition based on the evaluating.

The method 100 begins at a step 110. Next, at a step 120, the method 100 assesses whether a State of Charge (SOC) for the battery pack 24 is below a SOC over-discharge threshold, or a voltage for the battery pack 24 is below a voltage over-discharge threshold. If yes, the method 100 proceeds to a step 130 and considers the battery pack 24 to be operating such that over-discharge may occur. Otherwise, the method 100 continues to assess at the step 120. The check of the in the step 120 can help to, among other things, avoid some false alerts triggered by nonover-discharge conditions and save computational resources.

Figure 4:
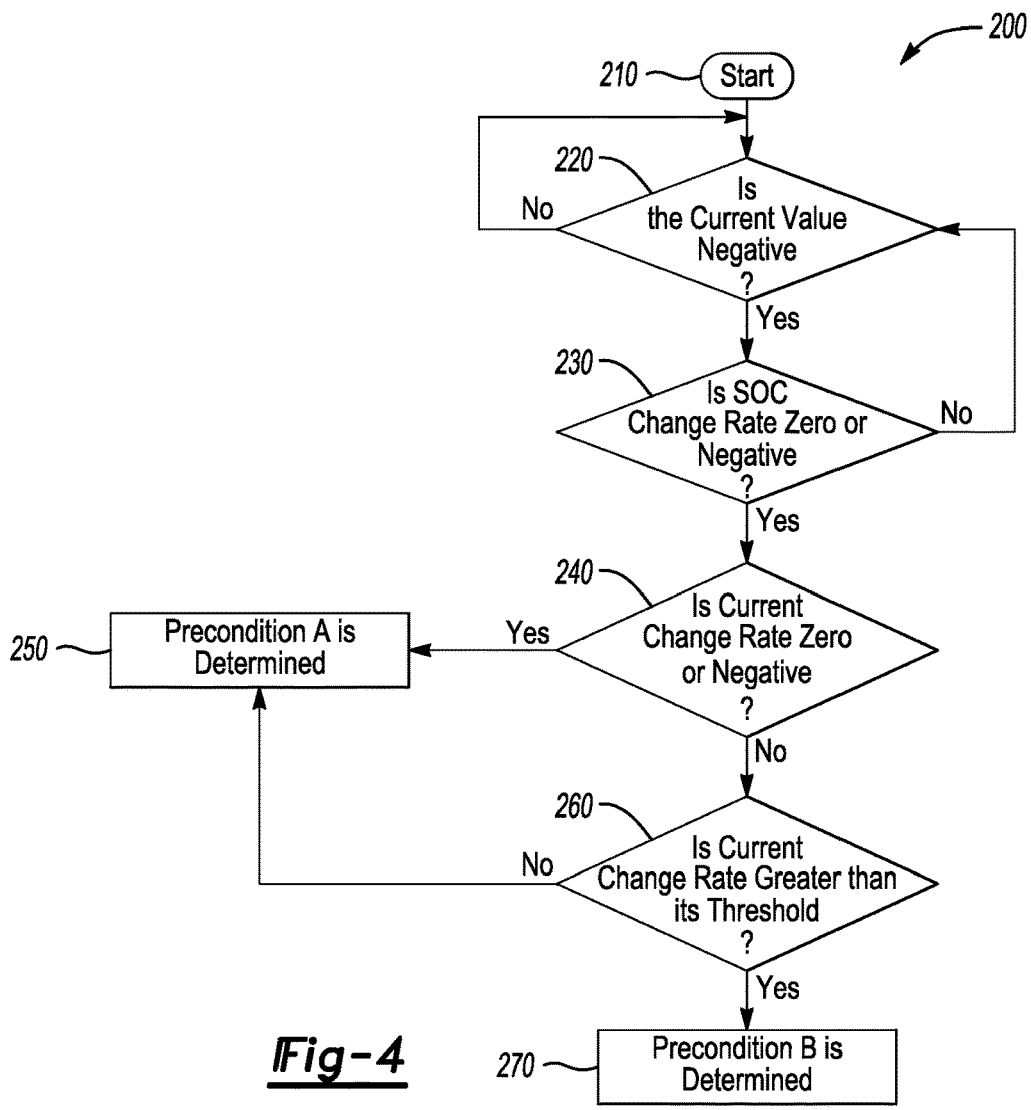
FIG. 4 illustrates an exemplary precondition determining method utilized by the over-discharge diagnosing method shown in FIG. 3.

At the step 130, the method 100 determining preconditions. The step 130 can use, for example, a precondition determining method 200 illustrated in FIG. 4 to determine the preconditions in the step 130. For the method 200, the direction of current is negative when current is flowing from the battery pack 24, and positive when current is flowing to the battery pack 24.

The method 200 begin as a step 210 and then, at a step 220, assesses whether the current is negative. If the current is not negative, the current is not flowing from the battery pack 24 and the method 200 continues to monitor. If the current is negative, current is flowing from the battery pack 24, and the method 200 moves from the step 220 to the step 230, where the method 200 assesses whether the SOC change rate over a given time is zero or negative. If the SOC change rate is zero or negative, energy has been pulled away from the battery pack 24 during the given time.

If yes at the step 230, the method 200 moves to the step 240, which assesses whether a current change rate is zero or negative. If yes at the step 240, the method 200 moves from the step 240 to a step 250 and assigns Precondition A. For the step 240, if the current is, for example, −5 Amps and then changes to be 5 Amps, the current change rate is positive. Correspondingly, if the current is 5 Amps and then changes to be −5 Amps, the current change rate is negative.

If, at the step 240, the current change rate is positive (i.e., not zero or negative), the method 200 moves from the step 240 to step 260 and determines if the current change rate is greater than a current change rate threshold value. The current change rate threshold can be calibrated, and it used to ensure both discharge current reduction and discharge current nonreduction cases are covered. Generally, battery voltage is expected to decrease or stay the same during discharge current nonreduction. Having the current change rate threshold can also help to prevent getting a false negative determination due to a minor fluctuation in current.

If the current change rate is not greater than the current change threshold value at the step 260, the method 200 moves from the step 260 to the step 250 and again assigns Precondition A. If the current change rate is greater than the current change threshold value at the step 260, the method 200 moves from the step 260 to the step 270 and assigns Precondition B.

Thus, if the method 200 assigns Precondition A, the current is negative and the current either stays the same or decreases over the given time, or the current is negative and the current increase over the given time is less than the current change rate threshold. If the method 200 assigns Precondition B, the current is negative but increasing over the given time and the change rate is greater than the current change rate threshold.

Returning to the method 100 in FIG. 3, after assigning Precondition A or B, the method 100 moves from the step 130 to evaluate over time, voltage behavior at a step 140*a*, current behavior at a step 140*b*, and temperature behavior at a step 140*c*. Although the evaluations for voltage, current, and temperature behaviors are shown separately, voltage, current, and temperature behaviors are evaluated concurrently, and are not evaluated sequentially.

A battery voltage increase during discharge can be an effective indicator for over-discharge. Battery voltage increase during discharge is mainly caused by a combination of change of internal resistance (including ohmic resistance, semicircle resistance, and charge-transfer resistance) and internal short circuit (ISC) resistance. The battery voltage typically does not increase when discharging unless either the internal resistance decreases sharply in a short time or ISC starts growing dramatically. A battery voltage increase can indicate an over-discharge condition not only at the early stage of an over-discharge but also at later stage where an internal short has existed.

Figure 5A:
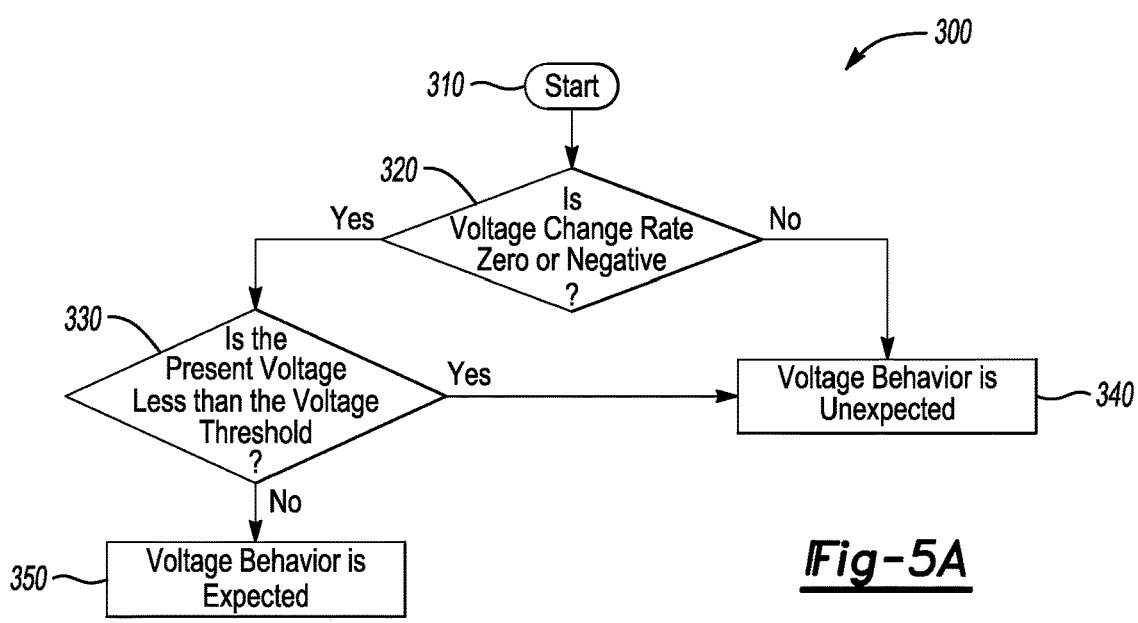
FIG. 5A illustrates an exemplary voltage behavior evaluation method utilized by the over-discharge diagnosing method shown in FIG. 3 when Precondition A is determined.
Figure 5B:
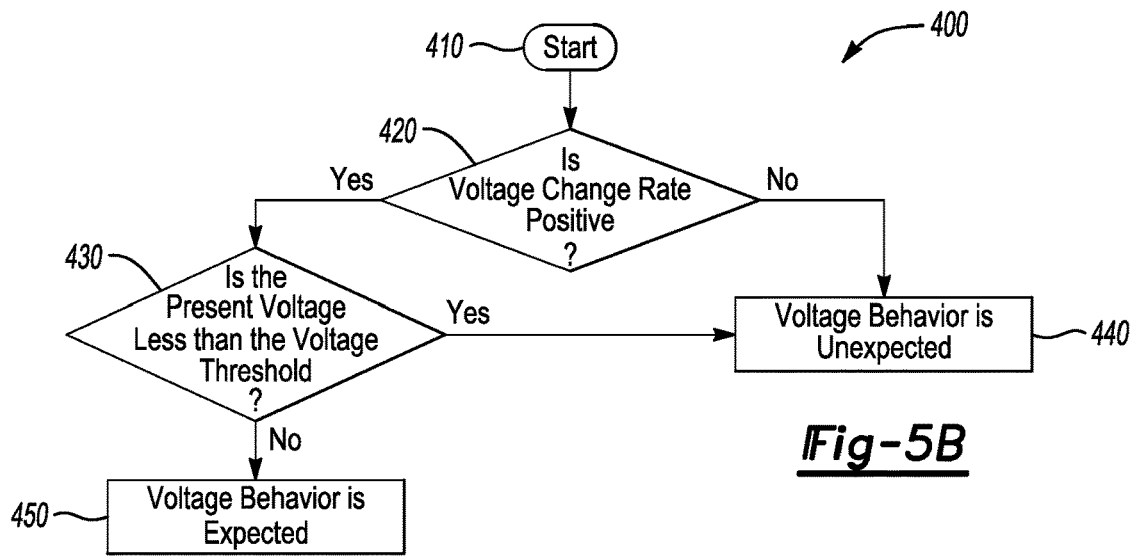
FIG. 5B illustrates an exemplary voltage behavior evaluation method utilized by the over-discharge diagnosing method shown in FIG. 3 when Precondition B is determined.

In an exemplary embodiment, a battery voltage change rate is used as a factor to determine whether the battery voltage behavior is expected in the step 140*a*. Another factor can be a comparison of the battery voltage to a battery voltage over-discharge threshold. Having a positive voltage change rate can imply a potential over-discharge. However, the battery voltage change rate, may be positive when discharging if the current decreases in a given time in some environments In an example, the evaluation of voltage behavior in the step 140*a* can proceed according to the method 300 shown in FIG. 5A if Precondition A was assigned in the step 130, and proceed according to the method 400 shown in FIG. 5B if Precondition B was assigned in step 130.

In the method 300 for Precondition A, after starting at a step 310, the method 300 evaluates at a step 320 whether the battery voltage change rate is either zero or negative. If the voltage change rate is either zero or negative, the present voltage is then compared with a voltage threshold at a step 330. The voltage threshold may be environment-dependent and can change in different environments.

If, at the step 330, the present voltage is less than the voltage threshold, the method 300 moves to a step 340 and indicates an unexpected voltage behavior. However, if the present voltage is equal or greater than the voltage threshold, the method 300 moves from the step 330 to a step 350 and indicates that an expected voltage behavior. Also, if the voltage change rate is positive at the step 320, the method 300 moves to the step 340 and indicates an unexpected voltage behavior.

In the method 400 for Precondition B, after starting at a step 410, the method 400 evaluates at a step 420 whether the battery voltage change rate is positive. If the voltage change rate is positive, the present voltage is then compared with the voltage threshold, at a step 430. If the voltage change rate, at the step 420 is zero or negative, the method 400 moves to a step 440 and indicates an unexpected voltage behavior.

If, at the step 430, the present voltage is less than the voltage threshold the method 400 also moves to the step 440 and indicates the unexpected voltage behavior. However, if the present voltage is equal or greater than the voltage over-discharge threshold, the method 400 moves from the step 430 to a step 450 and indicates an expected voltage behavior. Again, the voltage threshold may be environment-dependent and can change in different environments.

Figure 6:
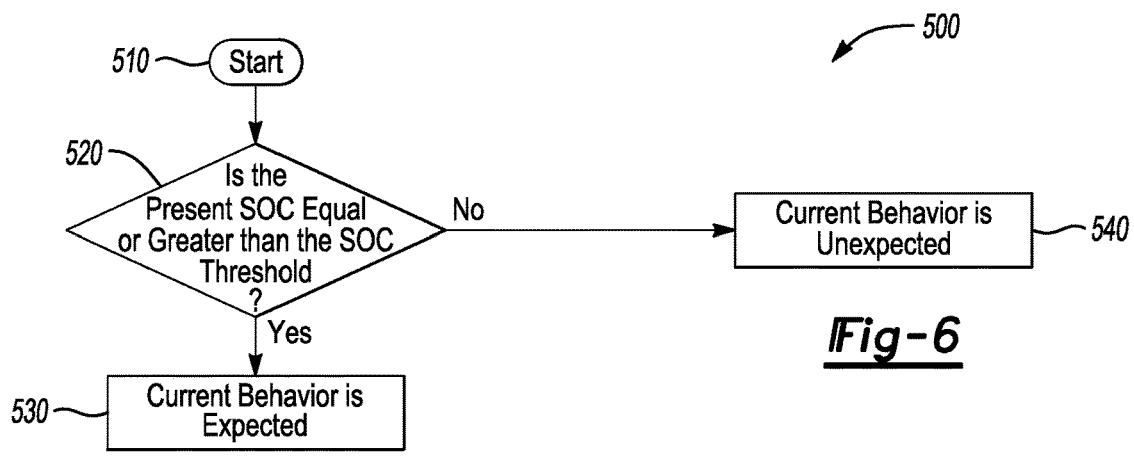
FIG. 6 illustrates an exemplary current behavior evaluation method utilized by the over-discharge diagnosing method shown in FIG. 3.

In the step 140b of the method 100, current related behaviors are evaluated in parallel with both the voltage behaviors and temperature behaviors. FIG. 6 illustrates an example current evaluation method 500.

The method 500 starts at a step 510 and then moves to a step 520, which assesses whether the SOC is equal or greater than a SOC threshold. If yes, the method 500 moves from the step 520 to a step 530 and indicates an expected current behavior. If no, the method 500 moves from the stop 520 to a step 540 and indicates an unexpected current behavior. To avoid over-discharge, SOC needs to be equal to or greater than the SOC threshold. The SOC threshold can be adjustable.

Figure 7:
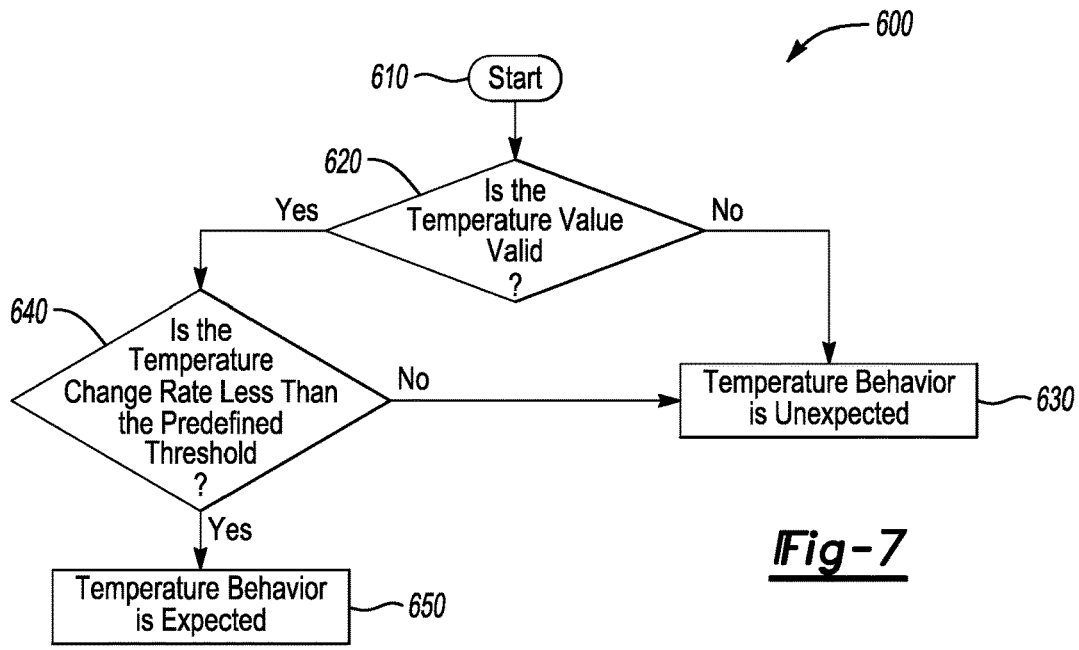
FIG. 7 illustrates an exemplary temperature behavior evaluation method utilized by the over-discharge diagnosing method shown in FIG. 3.

In the step 140c of the method 100, temperature behaviors are evaluated in parallel with both the voltage behaviors and the current related behaviors. FIG. 7 illustrates an example temperature evaluation method 600

The method 600 starts at a step 610 and then moves to a step 620, which assesses whether a given temperature value (e.g., measurement taken by a temperature measurement device within the battery pack) is valid at a step 620. The battery pack 24 can include one or more thermal measurement devices, such as thermistors and thermocouples. Each thermal measurement device is responsible for measuring temperature in a certain area of the battery pack 24. If the temperature value is not valid, the temperature values are not relied on. Validity of the temperature value can be assessed by, for example, comparing the given temperature value to a predefined range. If the given temperature value is outside the predefined range, the given temperature value is considered invalid. For instance, if a thermistor reading suddenly changes from 25° C. to 200° C. and the predefined range if from −40° C. to 85° C., the 200° C. reading is considered as invalid. The method 600 can be executed in connection with each temperature value associated with the battery pack 24.

If the temperature value is not valid, the method 600 moves from the step 620 to a step 630 and indicates an unexpected temperature behavior. If the temperature value is valid, the method 600 moves from the step 620 to a step 640.

At the step 640, the method 600 compares a temperature change rate obtained from the battery pack 24 to a predefined threshold. If the temperature change rate is less than the predefined threshold the method 600 moves from the step 640 to a step 650 and indicates an expected temperature behavior. Otherwise, the method 600 moves from the step 640 to the step 630 and indicates an unexpected temperature behavior. The predefined threshold can be adjustable.

Referring again to the method 100, after concurrently evaluating voltage, current and temperature behaviors at the steps 140a, 140b, and 140c, the method 100 moves to the step 150, which processes the results of the steps 140a, 140b, and 140c. If any of the steps 140a, 140b, and 140c resulted in unexpected behaviors, the method 100 moves to a step 160, which initiates an over-discharge notification. If none of the steps 140a, 140b, and 140c resulted in unexpected behaviors, the method 100 moves from the step 150 back to the step 130.

The pack controller 62 may communicate the over-discharge notification in the step 160. In an example, controllers that share the same communication bus with the pack controller 62 process the over-discharge notification and take proper actions. Such actions can include, but are not limited to, reducing current or power, notifying the user(s)/operator(s), sending responses to the pack controller 62 for further information.

In the exemplary embodiment, after the step 160, the pack controller 62 can, at a step 170, verify if battery current has been reduced to a current reduction threshold, which can be calibrated. If battery current has not been reduced to be less than the current reduction threshold, the pack controller 62 may wait for a predefined time at a step 180, and then open the main contactors 72, 78 at a step 190. If the battery current at the step 170 is reduced to be at or below the current reduction threshold, the pack controller 62 will open the main contactors 72, 78 at the step 190 without waiting the predefined time.

Figure 8:
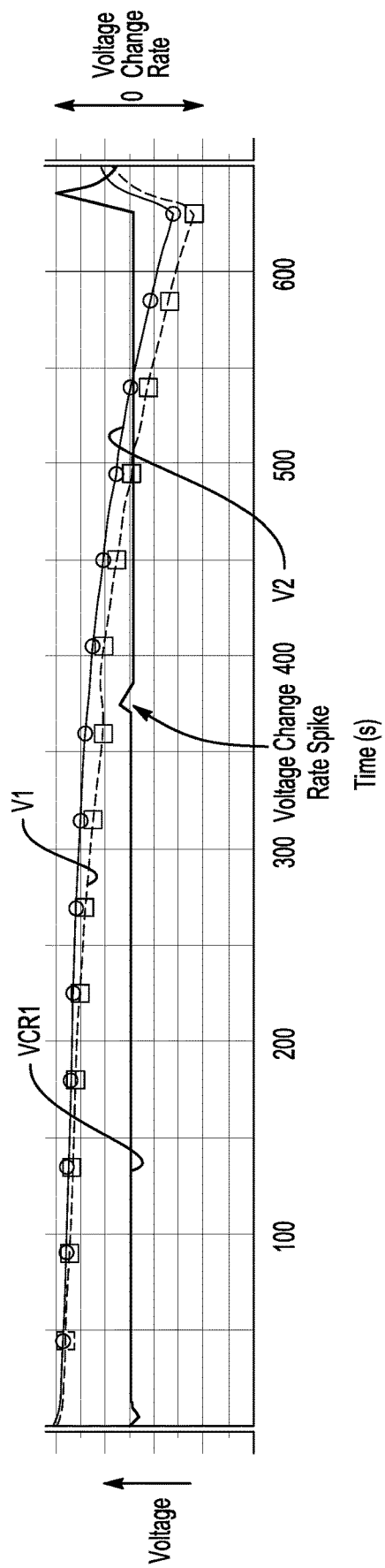
FIG. 8 graphically illustrates an exemplary change in a voltage change rate that the method of FIG. 3 detects to indicate an over-discharge of a battery cell within the battery pack of FIG. 2.

FIG. 8 graphically shows how the method 100 of FIG. 3 can be used to detect an over-discharge of the battery pack 24. A voltage over time for a first cell within the battery pack 24 is represented as V1, a voltage over time for a second cell within the battery pack 24 is represented as V2, a voltage change rate for the first cell is represented as VCR1.

The method 100 detects an over-discharge of the first cell at about 375 seconds due to the spike in the voltage change rate of the first cell. In the prior art, the over-discharge of the first cell is not detected until about 630 seconds when the voltages of the first cell drops below a threshold value, say 2.27 Volts. In the prior art, the over-discharge was detected based on a comparison of voltage to a voltage threshold of 2.3 Volts. Thus, the method 100 and the other examples of this disclosure can detect an over-discharge condition considerably sooner than the methods of the prior art.

Battery packs can include a limited number of thermal measurement devices, resulting in a limited number of thermal measurements. When a limited number of thermal measurements are taken, a change in a temperature change rate may not be fully captured or appreciated. Unlike the prior art, the method 100 takes a holistic approach to detecting over-discharge that not only uses temperature information from limited thermal measurements, but also voltage and current information. In the example of FIG. 8, the spike in the voltage change rate was detected, which is indicator of an over-discharge.

To detect an over-discharge condition, the exemplary method 100 can rely on relationships among current, current change rates, and SOC change rates, not just a SOC threshold or a voltage thresholds.

Exemplary features of some of the disclosed embodiments of this disclosure can include improving the effectiveness of detecting over-discharge by simultaneously evaluating voltage, current and temperature behaviors. Over-discharge not only causes unexpected behaviors in temperature, but also results in corresponding behaviors that can be captured by the other kinds of measurements such as voltage and/or current.

Another feature is reducing the need to rely on a limited number of thermal measurements needed to use thermal measurements to indicate an over-discharge. If a thermal change resulting from over-discharge is difficult to detect, the over-discharge could be detected by the other kinds of measurements.

Another feature is the implementation of an effective voltage indicator to dynamically detect unexpected behaviors either caused by over-discharge or resulting in over-discharge. This can prevent deterioration of the battery pack due to over-discharge by detecting over-discharge more quickly.

Other features include reducing calibration work for threshold tuning, reducing the possibility of false negative alerts, increasing battery life, reducing warranty returns due to over-discharge, and reducing the need to include extra temperature measurement devices into battery packs to detect extra heat generated in over-discharge.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. An over-discharge diagnosing method, comprising:
evaluating concurrently, a voltage behavior of a battery pack, a current behavior of the battery pack, and a temperature behavior of the battery pack;
detecting an over-discharge based on the evaluating;
communicating an over-discharge notification in response to the detecting; and
detecting the over-discharge based on a current change rate being zero or negative, and a voltage change rate being zero or negative and less than a voltage threshold value.

2. The method of claim 1, wherein the detecting does not occur unless a current value of the battery pack is negative and a state of charge change rate of the battery pack is zero or negative.

3. The method of claim 1, further comprising detecting the over-discharge based on a state of charge of the battery pack being less than a state of charge threshold.

4. The method of claim 1, further comprising detecting the over-discharge based on a temperature change rate of the battery pack being greater than or equal to a predefined threshold.

5. The method of claim 1, further comprising reducing current in response to the over-discharge notification.

6. The method of claim 5, further comprising opening contactors of the battery pack in response to the over-discharge notification.

7. The method of claim 1, further comprising opening contactors of the battery pack in response to the over-discharge notification.

8. The method of claim 1, further comprising transmitting an alert to a user in response to the over-discharge notification.

9. The method of claim 1, wherein the over-discharge detected during the detecting is an over-discharge of a battery cell within the battery pack.

10. The method of claim 1, wherein the battery pack is a traction battery pack of an electrified vehicle.

11. An over-discharge diagnosing method, comprising:
evaluating concurrently, a voltage behavior of a battery pack, a current behavior of the battery pack, and a temperature behavior of the battery pack;
detecting an over-discharge based on the evaluating;
communicating an over-discharge notification in response to the detecting; and
detecting the over-discharge based on a current change rate being both positive and greater than a threshold current change rate, and a voltage change rate being positive but less than a voltage threshold.

12. An over-discharge diagnosing assembly, comprising:
a battery pack; and
a controller configured to detect an over-discharge by evaluating, concurrently, a voltage behavior, a current behavior, and a temperature behavior of the battery pack,
the controller further configured to communicate an over-discharge notification in response to the controller detecting the over-discharge,
wherein the controller is configured to detect the over-discharge based on a current change rate being both positive and greater than a threshold current change rate, and a voltage change rate being positive but less than a voltage threshold.

13. The assembly of claim 12, wherein the battery pack is a traction battery pack of an electrified vehicle.

14. The assembly of claim 12, further comprising contactors configured to open in response to the controller detecting the over-discharge.

15. The assembly of claim 12, wherein the controller is a bussed electrical center.

16. The assembly of claim 12, wherein the over-discharge is an over-discharge of at least one battery cell within the battery pack.

* * * * *